(12) United States Patent
Liu et al.

(10) Patent No.: US 10,103,166 B1
(45) Date of Patent: Oct. 16, 2018

(54) SEMICONDUCTOR DEVICE AND CRITICAL DIMENSION DEFINING METHOD THEREOF

(71) Applicant: MACRONIX INTERNATIONAL CO., LTD., Hsinchu (TW)

(72) Inventors: Kuan-Cheng Liu, Taichung (TW); Yu-Lin Liu, New Taipei (TW); Cheng-Wei Lin, Hsinchu (TW); Chin-Cheng Yang, Kaohsiung County (TW); Shou-Wei Huang, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 23 days.

(21) Appl. No.: 15/483,019

(22) Filed: Apr. 10, 2017

(51) Int. Cl.
| | |
|---|---|
| *H01L 29/792* | (2006.01) |
| *H01L 27/11582* | (2017.01) |
| *H01L 23/544* | (2006.01) |
| *H01L 23/528* | (2006.01) |
| *H01L 21/28* | (2006.01) |
| *H01L 21/768* | (2006.01) |
| *H01L 21/027* | (2006.01) |
| *H01L 21/311* | (2006.01) |

(52) U.S. Cl.
CPC .... *H01L 27/11582* (2013.01); *H01L 21/0273* (2013.01); *H01L 21/28282* (2013.01); *H01L 21/31111* (2013.01); *H01L 21/31144* (2013.01); *H01L 21/76895* (2013.01); *H01L 23/528* (2013.01); *H01L 23/544* (2013.01); *H01L 2223/54426* (2013.01)

(58) Field of Classification Search
USPC ....... 257/324, 120, 124, 133, 127, 146, 153, 257/157
See application file for complete search history.

(56) References Cited

U.S. PATENT DOCUMENTS

| | | | |
|---|---|---|---|
| 2007/0134923 | A1 | 6/2007 | Chen et al. |
| 2010/0025824 | A1* | 2/2010 | Chen ...................... H01L 23/585 257/620 |
| 2012/0057159 | A1 | 3/2012 | Deckers et al. |
| 2013/0120739 | A1 | 5/2013 | Dai et al. |
| 2014/0036243 | A1 | 2/2014 | Beyer et al. |
| 2014/0264525 | A1* | 9/2014 | Takahashi ............. H01L 27/115 257/314 |
| 2015/0179662 | A1* | 6/2015 | Makala ............. H01L 27/11582 257/314 |
| 2016/0079179 | A1 | 3/2016 | Shiba |
| 2016/0099176 | A1* | 4/2016 | Matsuzaki .......... H01L 33/0095 438/464 |

* cited by examiner

*Primary Examiner* — Tram H Nguyen
(74) *Attorney, Agent, or Firm* — McClure, Qualey & Rodack, LLP (57) ABSTRACT

A semiconductor device includes a semiconductor substrate, a circuit unit and an align mark. The circuit unit is disposed on the semiconductor substrate. The align mark includes a first part and a second part respectively formed in the semiconductor substrate and adjacent to two opposite sides of the circuit unit, wherein the first part and the second part depart from each other for a predetermined distance along with a first direction.

11 Claims, 10 Drawing Sheets

SEMICONDUCTOR DEVICE AND CRITICAL DIMENSION DEFINING METHOD THEREOF

BACKGROUND

Technical Field

The disclosure of the present disclosure generally relates to an integrated circuit (IC) and method for fabricating the same, and more particularly to a semiconductor device and the critical dimension (CD) defining method thereof.

Description of the Related Art

As the CD of an integrated circuit is minimized to the process limitation, the accuracy requirement to a photoresist photolithography and patterning process becomes higher and higher. Currently, because it is hard to measure the CD of the photoresist during the photoresist photolithography and patterning process, a CD bar disposed on a scribe lines is typically used to serve as a reference for simulating the photoresist patterning, and the CD of the photoresist can be thus indirectly define by the simulation results.

However, when the thickness and width of the photoresist is increased, the simulation results of the photoresist patterning may not be accurate enough to define the CD of the photoresist, due to the shrinkage rate difference between the patterned photoresist and the CD bar that are both subjected to the photolithography steps. The CD variation of the patterned photoresist may not be controlled with in the tolerance without providing any other reference, and the yield and reliability of the process for fabricating the semiconductor device may be severely deteriorated.

Therefore, there is a need of providing a semiconductor device and the CD defining method thereof to obviate the drawbacks encountered from the prior art.

SUMMARY

In one Embodiment of the present disclosure, a semiconductor device is disclosed, wherein the semiconductor device includes a semiconductor substrate, a circuit unit and an align mark. The circuit unit is disposed on the semiconductor substrate. The align mark includes a first part and a second part respectively formed in the semiconductor substrate and adjacent to two opposite sides of the circuit unit, wherein the first part and the second part depart from each other for a predetermined distance along with a first direction.

In accordance with another embodiment of the present disclosure, a CD defining method of a semiconductor device is provided, wherein the method includes steps as follows: Firstly, a semiconductor substrate having a predetermined region is provided. An align mark including a first part and a second part is then formed in the semiconductor substrate to make the first part and the second part disposed adjacent to two opposite sides of the predetermined region and departing each other for a predetermined distance along with a first direction. A circuit unit is formed on the predetermined region simultaneous to the forming of the align mark.

In accordance with the aforementioned embodiments of the present disclosure, a semiconductor device and a CD defining method thereof are provided. An align mark including a first part and a second part is formed in a semiconductor substrate simultaneous to the forming of a circuit on a predetermined region of the semiconductor substrate, wherein the first part and the second part are disposed adjacent to the two opposite sides of the circuit unit and depart from each other for a predetermined distance along with a direction. By forming the align mark, the photoresist used for forming the circuit unit can be precisely formed on the predetermined region located between the first part and the second part of the align mark. Such that the CD of the circuit unit can be secured to fall within the tolerance, and the yield and reliability of the process for fabricating the semiconductor device can be improved significantly.

The above objects and advantages of the present disclosure will become more readily apparent to those ordinarily skilled in the art after reviewing the following detailed description and accompanying drawings, in which:

DETAILED DESCRIPTION

The embodiments as illustrated below provide a semiconductor device and a CD defining method thereof to improve the yield and reliability of the process for fabricating the same. The present disclosure will now be described more specifically with reference to the following embodiments illustrating the structure and method for fabricating the memory device.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily drawn to scale, and the identical elements of the embodiments are designated with the same reference numerals.

FIGS. 1A to 1I are cross-sectional views illustrating the processing structures for forming a semiconductor device 100 in accordance with one embodiment of the present disclosure. In the present embodiment, the semiconductor device 100 is a memory device having a vertical channel structure. The method for fabricating the semiconductor device 100 includes steps as follows: Firstly, a semiconductor substrate 101 having a predetermined region 101a is provided. In some embodiments of the present disclosure, the semiconductor substrate 101 may be made of a p-type doped, n-type doped or undoped semiconductor material, such as poly-silicon, germanium (Ge) or any other suitable semiconductor material.

Figure 1A:
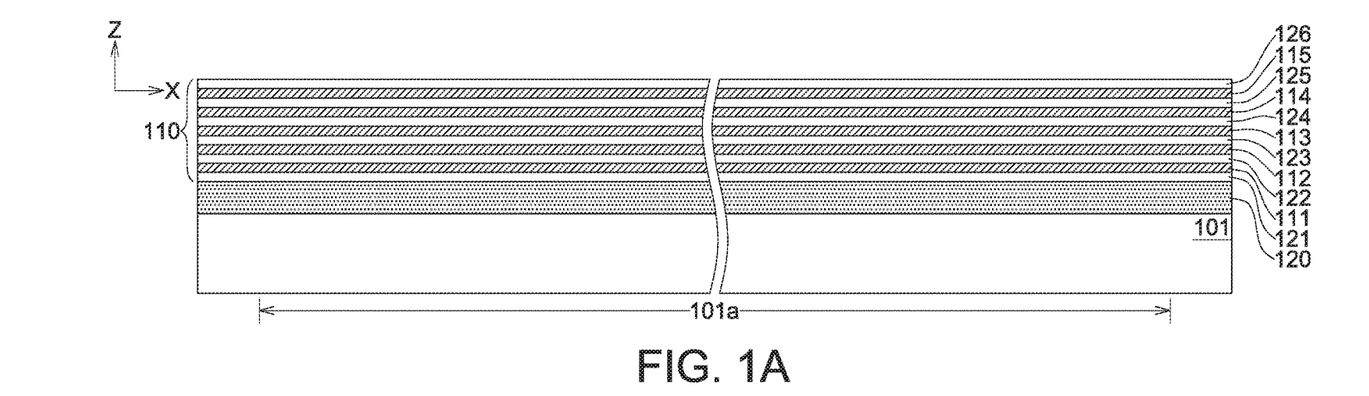
FIGS. 1A to 1I are cross-sectional views illustrating the processing structures for forming a semiconductor device in accordance with one embodiment of the present disclosure.

Next, a first conductive layer 120 is formed on the semiconductor substrate 101 and a multilayers stack 110 is then provided on the first conductive layer 120 covering on the predetermined region 101a and extending beyond the predetermined region 101a. In some embodiments of the present disclosure, the first conductive layer 120 can be an ion implantation layer formed in the semiconductor substrate 101. The multilayers stack 110 includes a plurality of insulating layers 121-126 and a plurality of sacrificing layers 111-115 formed on the first conductive layer 120. The insulating layers 121-126 and the sacrificing layers 111-115 are parallel to each other and alternatively stacked on the first conductive layer 120 along the Z axle as shown in FIG. 1A. In the present embodiment, the insulating layer 126 serves as the top-most layer of the multilayers stack 110, and the insulating layer 121 serves as the bottommost layer and the top-most layer of the multilayers stack 110 and is directly in contact with the first conductive layer 120 (see FIG. 1A).

In some embodiments of the present disclosure, the sacrificing layers 111-115 and the insulating layers 121-126 may be both formed by a low pressure chemical vapor deposition (LPCVD), however, the material for configuring the sacrificing layers 111-115 may be different from that for configuring can be made of silicon-nitride compounds, such as SiN, SiON, silicon carbonitride (SiCN), or the arbitrary combinations thereof. The insulating layers 121-126 may be made of dielectric material other than the material made of the sacrificing layers 111-115, such as silicon oxide, silicon carbide (SiC), silicate or the arbitrary combinations thereof. In the present embodiment, the sacrificing layers 111-115 are made of SiN with a thickness about 520 Å, and the insulating layers 121-125 are made of silicon dioxide ($SiO_2$) with a thickness about 280 Å.

Next, an etching process is performed to form a plurality of through openings 110a passing through the multilayers stack 110, so as to expose a portion of the first conductive layer 120. In some embodiments of the present disclosure, the etching process can be an anisotropic etching process, such as a reactive ion etching (RIE) process, performed on the multilayers stack 110 using a patterned hard mask layer (not shown) as an etching mask. The through openings 110a may be a plurality of through holes passing through the multilayers stack 110 along the Z axle used to expose a portion of the first conductive layer 120 semiconductor substrate 101 serving as the bottom of the through openings 110a and to expose portions of the sacrificing layers 111-115, the insulating layers 121-126 and the isolation layer 103 serving as the sidewalls of the through openings 110a.

Figure 1B:
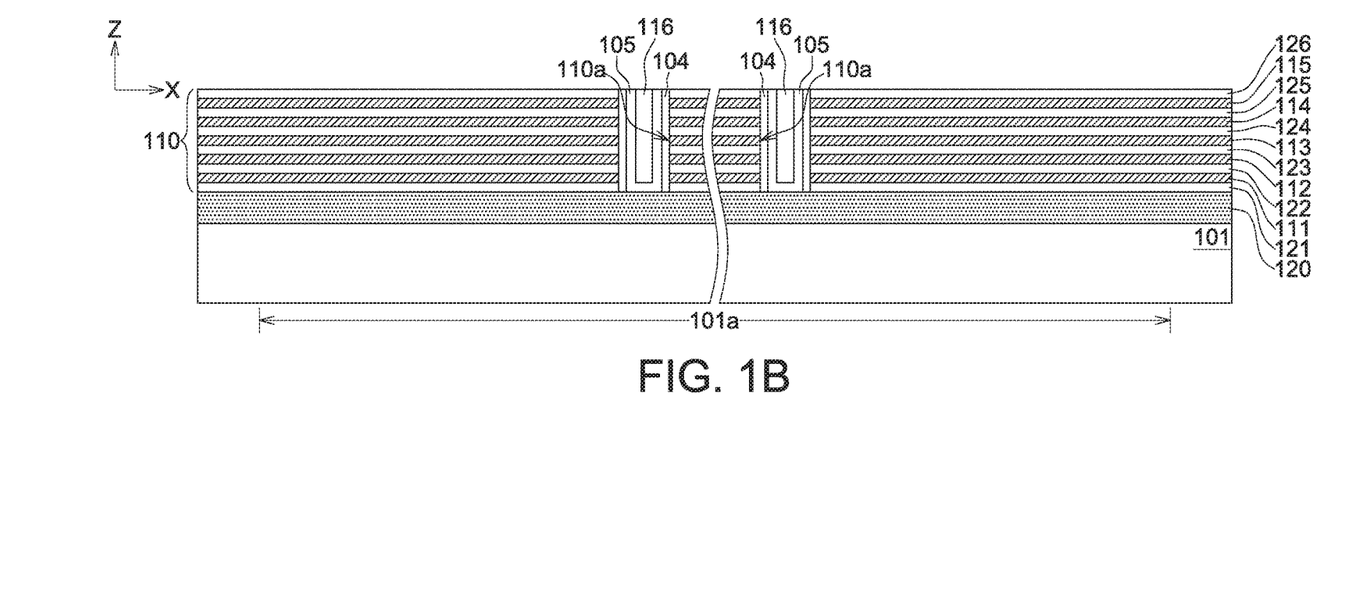
Figure 1C:
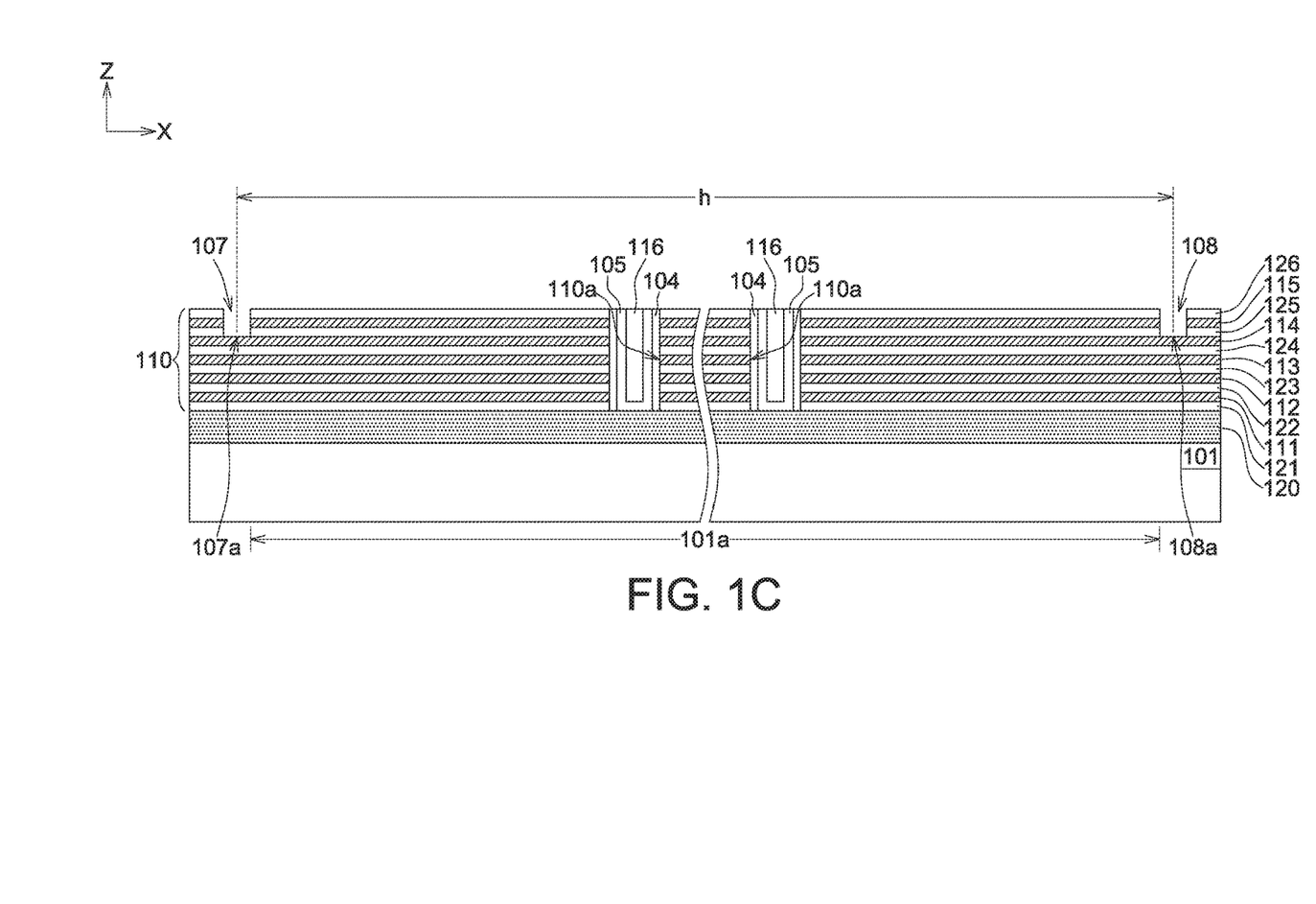
Figure 1D:
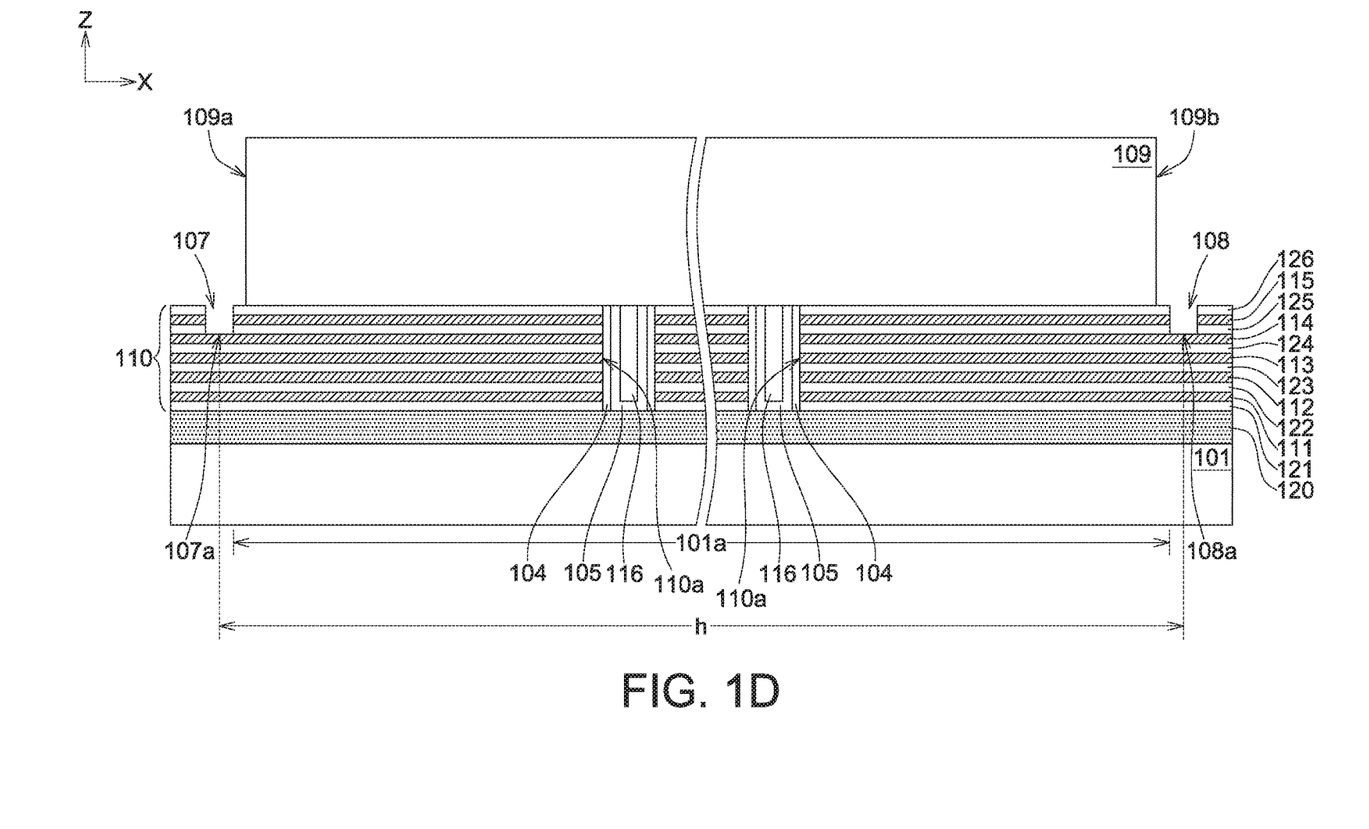

Next, a memory layer 104 and a channel layer 105 are formed in sequence on sidewalls of the through opening 110a to make the memory layer 104 disposed between the channel layer 105 and the portions of sacrificing layers 111-115 exposed from the through opening 110a, and a dielectric material 116 is then fulfilled in the through openings 110a (see FIG. 1B). In some embodiments of the present disclosure, the memory layer 104 may include (but not limited to) an oxide-nitride-oxide (ONO), oxide-nitride-oxide-nitride-oxide(ONONO) or oxide-nitride-oxide-nitride-oxide-nitride-oxide (ONONONO) structure. The channel layer 105 can be made of silicon (Si), Ge or other doped/undoped semiconductor material. The dielectric material 116 can be silicon oxide, SiC, silicate or the arbitrary combinations thereof.

Subsequently, an opening etching process is performed to form a first recess 107 and a second recess 108 in the portion of the multilayers stack 110 extending beyond the predetermined region 101a, wherein the first recess 107 and the second recess 108 are formed adjacent to the opposite sides of the predetermined region 101a; and the center 107a of the first recess 107 departs form the center 108a of the second recess 108 for a predetermined distance h along the direction parallel to the x-axis. In some embodiments of the present disclosure, the first recess 107 and the second recess 108 respectively extends downwards passing through the top-most insulating layer 126 and the top-most sacrificing layer 115 of the multilayers stack 110 along the Z-axle from the top surface of the multilayers stack 110 (see FIG. 1C). In the present embodiment, the first recess 107 and the second recess 108 can be two parallel slits respectively having a long axil perpendicular to the x-axis.

Thereafter, a patterned photoresist layer 109 is formed to cover the portion of the multilayers stack 110 disposed in the predetermined region 101a and make the left edge 109a and the right edge 109b of the pattered photoresist layer 109 respectively depart from the first recess 107 and the second recess 108 for a distance substantially less than 5 micro meters (μm). Wherein the left edge 109a and the right edge 109b of the pattered photoresist layer 109 are parallel to the Z-axil (see FIG. 1D), and the pattered photoresist layer 109 has a thickness about 5 μm.

Figure 1E:
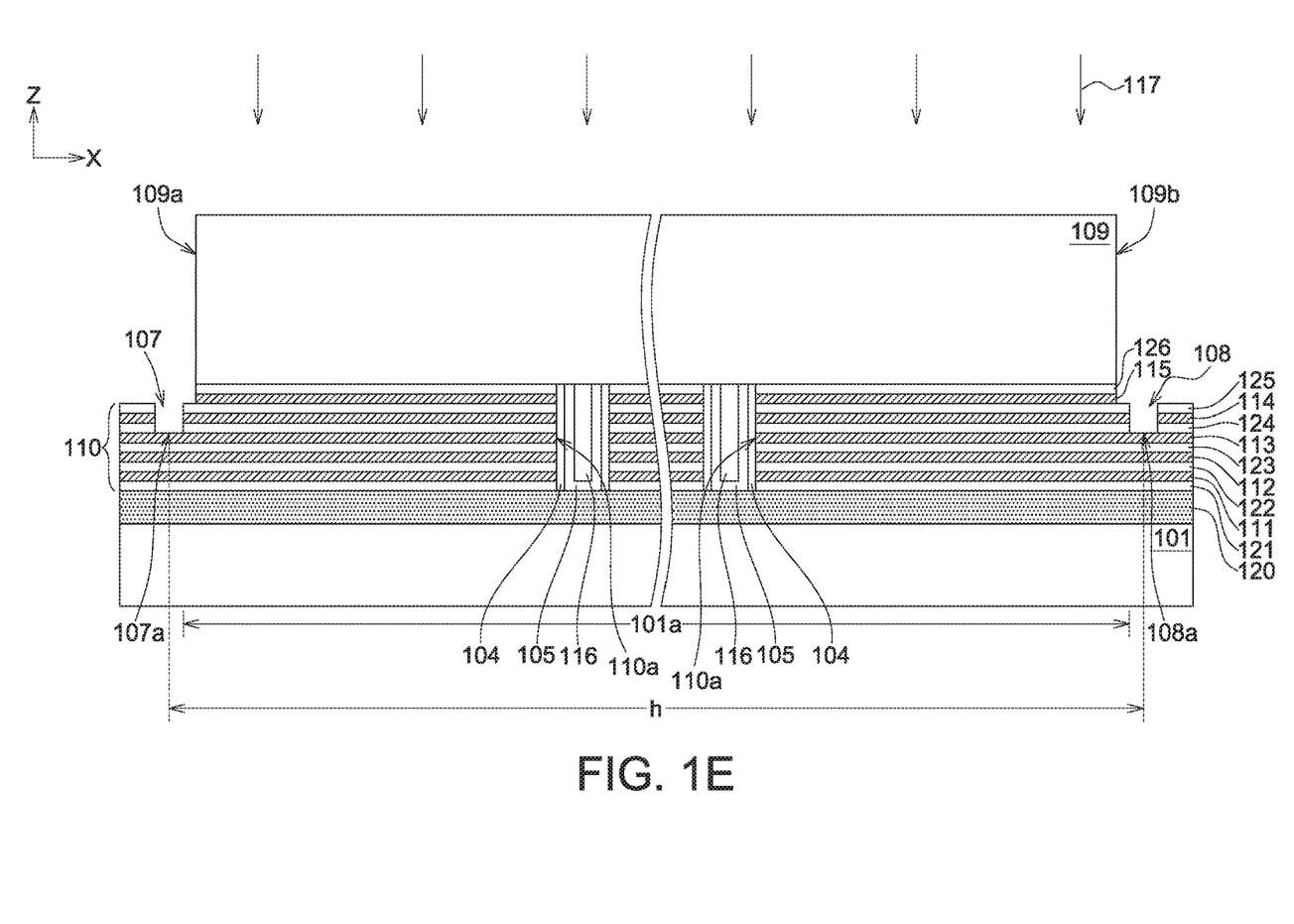

An etching process 117 using the patterned photoresist layer 109 as the etch mask is then performed to remove the portions of the top-most insulating layer 126 and the top-most sacrificing layer 115 of the multilayers stack 110 that are not covered by the patterned photoresist layer 109, so as to expose a portion of the second insulating layer 125 and to make the first recess 107 and the second recess 108 extending downwards at least passing through the second insulating layer 125 and the second sacrificing layer 114 of the multilayers stack 110 (see FIG. 1E).

Figure 1F:
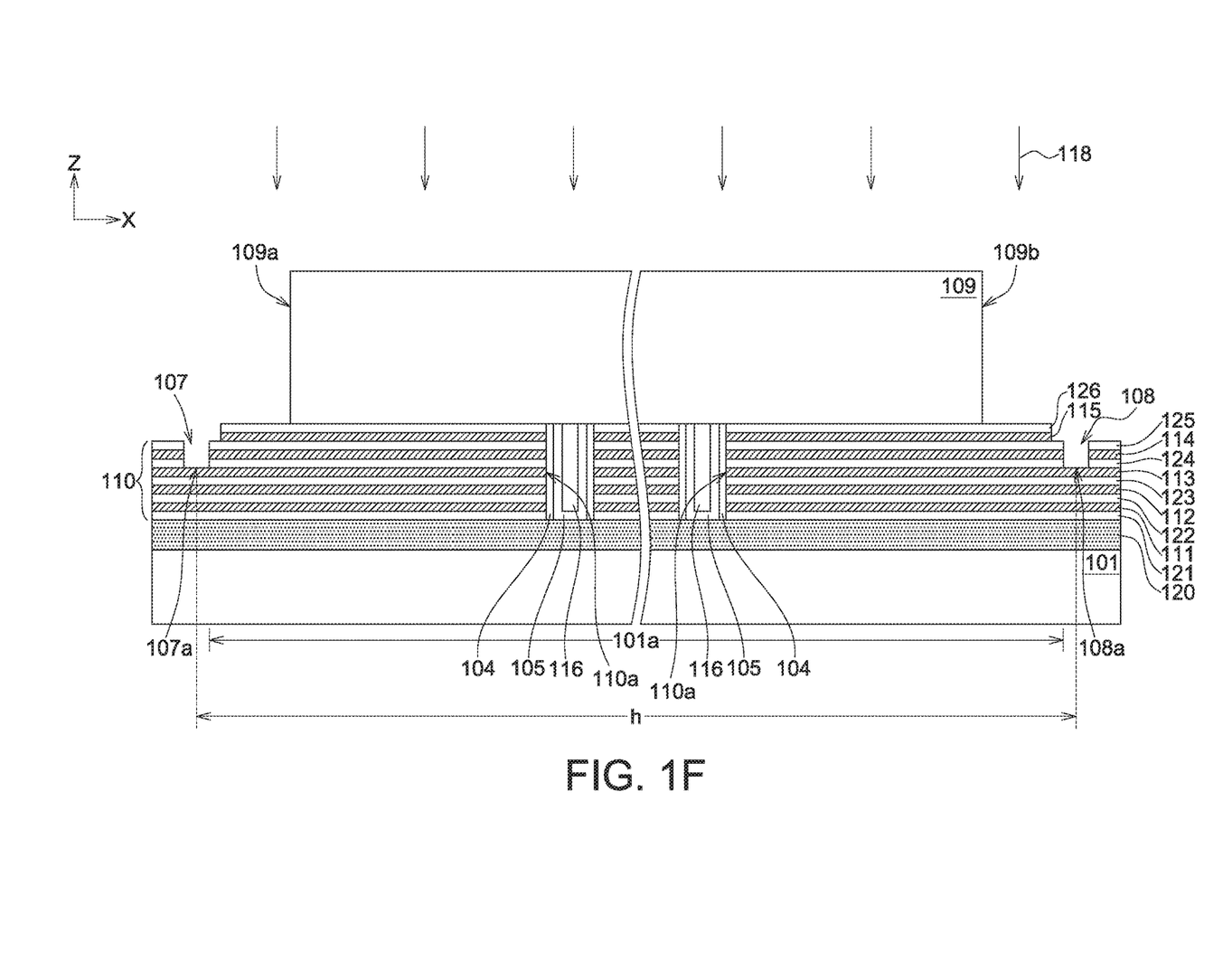
Figure 1G:
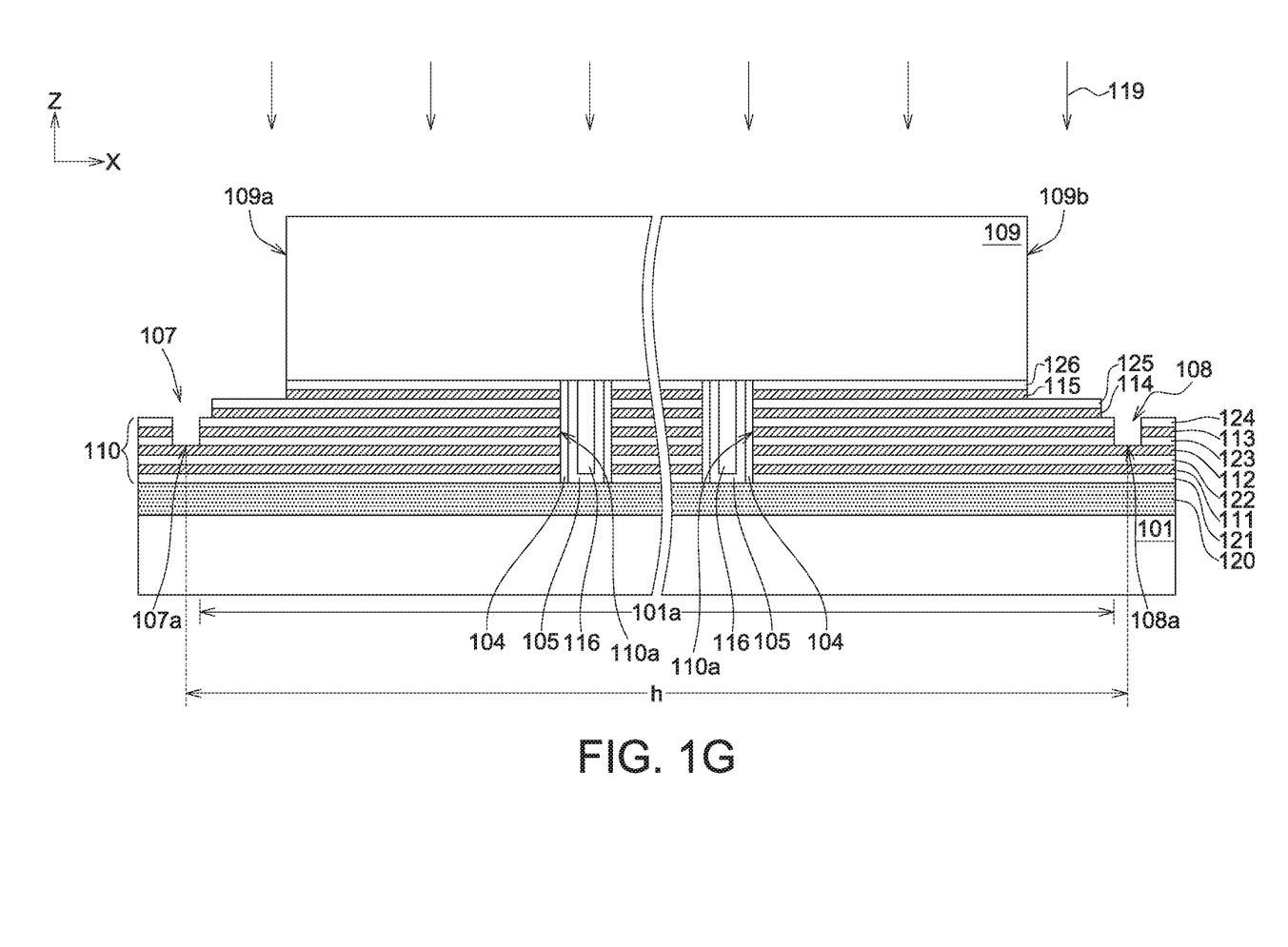
Figure 1H:
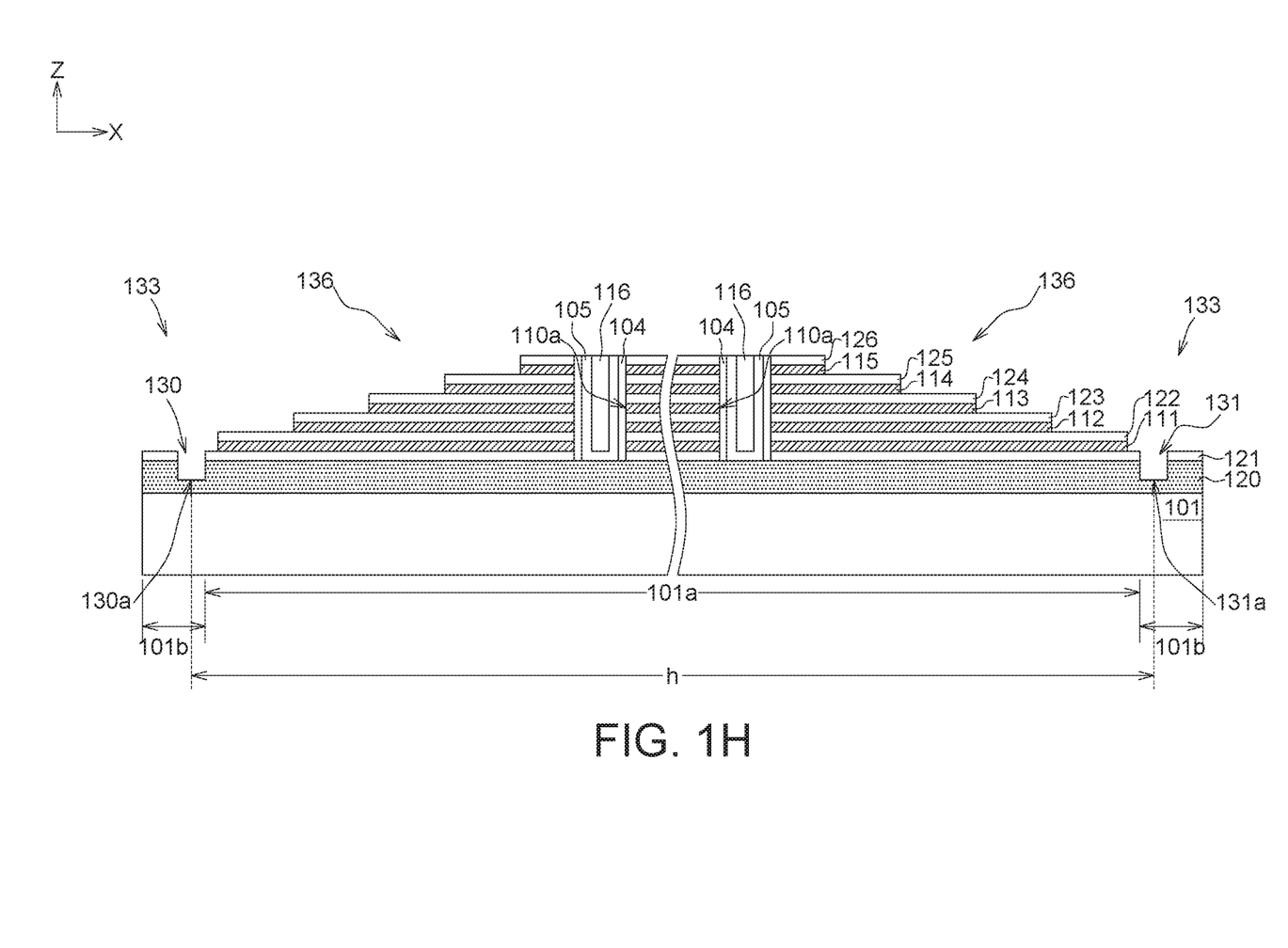

Next, a photoresist trimming process 118 is performed to remove a portion of the patterned photoresist layer 109 in a manner of pulling back the left edge 109a and the right edge 109b of the pattered photoresist layer 109 to expose a portion of the top-most insulating layer 126 (see FIG. 1F). Another etching process 119 using the trimmed photoresist layer 109 as the etch mask is then performed to remove the portions of the top-most insulating layer 126, the top-most sacrificing layer 115, the second insulating layer 125 and the second sacrificing layer 114 of the multilayers stack 110 that are not covered by the trimmed photoresist layer 109, so as to expose portions of the second insulating layer 125 and the third insulating layer 124 and to make the first recess 107 and the second recess 108 extending downwards at least passing through the third insulating layer 124 and the third sacrificing layer 113 of the multilayers stack 110 (see FIG. 1G).

The photoresist trimming process 118 and the etching process 119 are repeated until a portion of the first conductive layer 120 is exposed by the subsequent etching process 119, whereby a stair case structure 136 having a stair profile gradually declining from inside to out is formed on the periphery area of the multilayers stack 110, and a first opening 130 and a second opening 131 are respectively formed in the outer edges 101b of the predetermined region 101a and adjacent to the opposite sides of the stair case structure 136 along with the direction parallel to the X-axil and extending in to the substrate 101 from the top surface of the first conductive layer 120. In the present embodiment, the center 130a of the first opening 130 and the center 131a of the second opening 131 are respectively overlapped with the center 107a of the first recess 107 and the center 108a of the second recess 108. In other words, the center 103a of the first opening 130 can depart form the center 131a of the second opening 131 along with the direction parallel to the X-axil for a distance substantially equal to the predetermined distance h; and the stair case structure 136 respectively departs from the first opening 130 and the second opening 131 for a distance substantially less than 5 μm. (see FIG. 1H).

After the forming of the stair case structure 136, the remaining sacrificing layers 111-115 are removed. In the present embodiment, phosphoric acid ($H_3PO_4$) solution is utilized to remove the remaining sacrificing layers 111-115. Next, a plurality of second conductive layers 127 are formed on the positions where the remaining sacrificing layers 111-115 initially occupied. As a result, a plurality of memory cells 128a can be defined at the intersection points of the second conductive layers 127, the memory layer 104 and the channel layer 105, so as to form a memory cell array 128 in the multilayers stack 110. After a series back end of line (BEOL) processes are carried out, a plurality of contact plug 129 are formed and each of which is electrically connected to one of the second conductive layers 127 of the multilayers stack 110. Meanwhile, the semiconductor device 100 having a memory cell array 128 (a circuit unit) as shown in FIG. 1I can be accomplished.

Figure 1I:
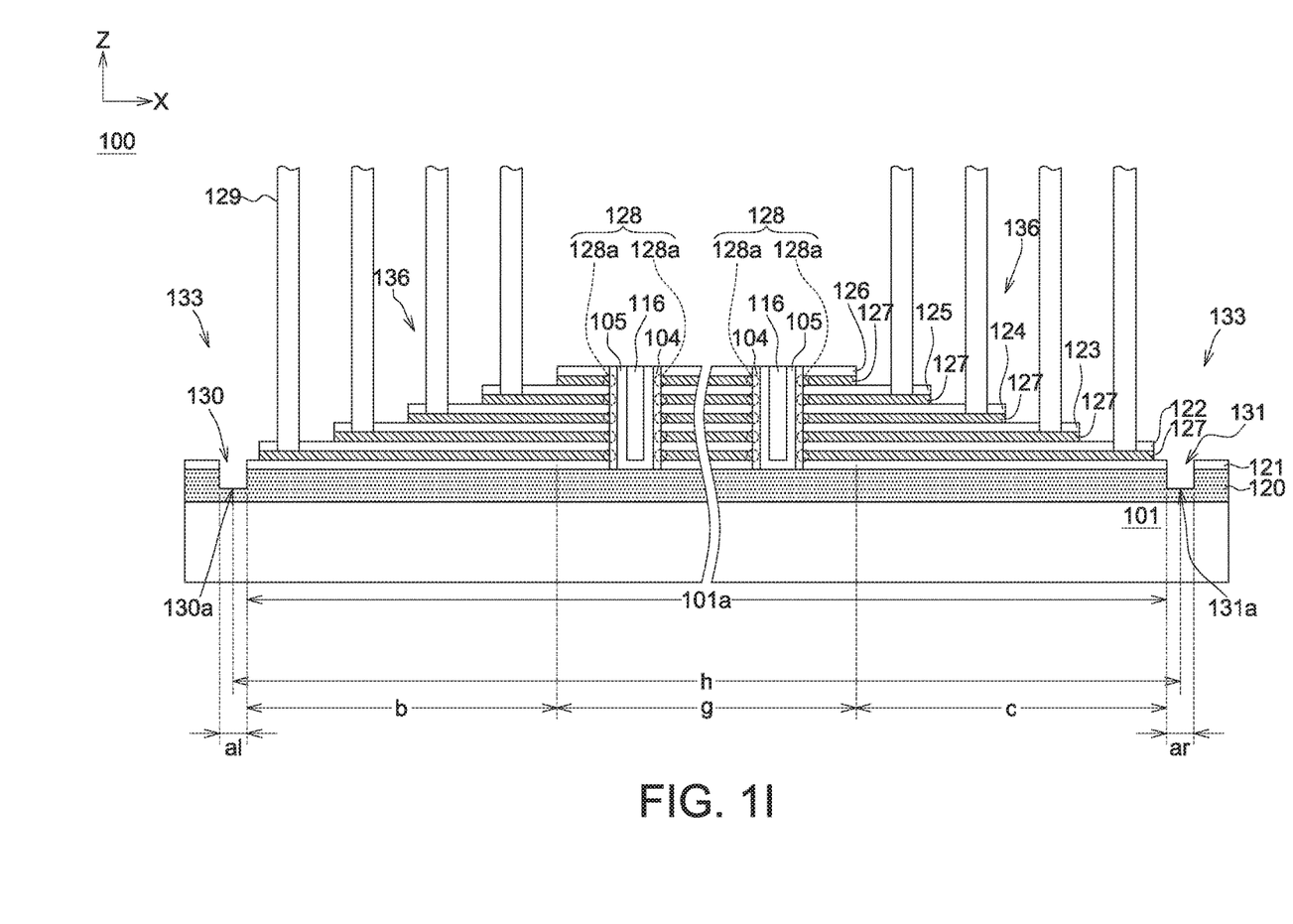
Figure 2:
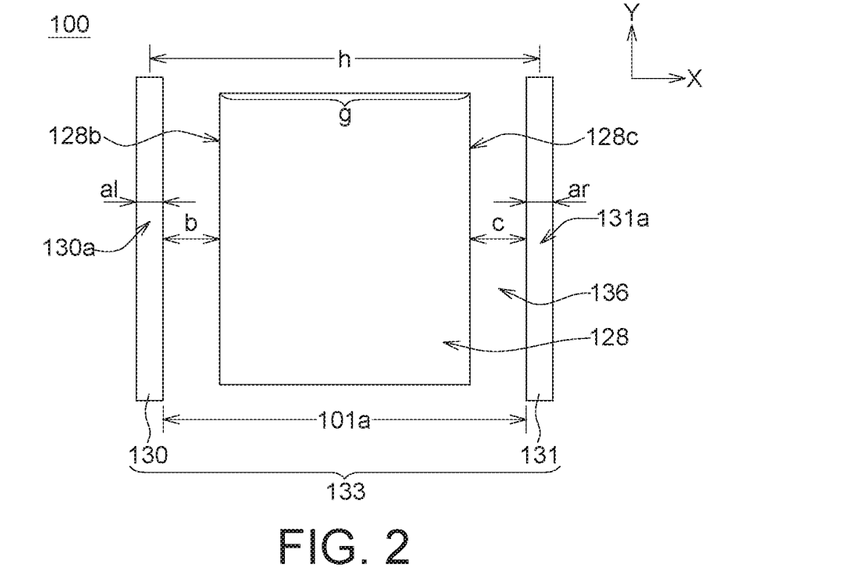
FIG. 2 is a top view illustrating the structure of the semiconductor device as shown in FIG. 1I, in accordance with one embodiment of the present disclosure.

FIG. 2 is a top view illustrating the structure of the semiconductor device as shown in FIG. 1I, in accordance with one embodiment of the present disclosure. In the present embodiment, the first opening 130 and the second opening 131 can be two parallel slits having a long axil perpendicular to the X-axis and serving as the first part and the second part of the align mark 133 respectively. The first opening 130 has a width al along with the X-axis; the second opening 131 has a width ar along with the X-axis; the stair case structure 136 departs from the first opening 130 for a distance b and departs from the second opening 131 for a distance c along with the X-axis; the memory cell array 128 has a width g along with the X-axis (measured from the outer edge 128b to the outer edge 128c); and the sum of g, al/2, ar/2, b and c (g+al/2+ar/2+b+c) can be substantially equal to the predetermined distance h measured from the center 103a of the first opening 130 to the center 131a of the second opening 131 along with the X-axis. In the present embodiment, the distance b and c are substantially less than 500 μm, and the predetermined distance h will larger than 2500 μm which closes to a device cell size (a size of single one of the memory cells 128a).

Since the first opening 130 and the second opening 131 that respectively serve as the first part and the second part of the align mark 133 are formed simultaneously to the forming of the stair case structure 136, thus the position and the CD of the patterned photoresist layer 109 used for forming the stair case structure 136 can be precisely defined by a measurement (e.g. utilizing an in-line Scanning Electron Microscope (in-line SEM)) using the align mark 133 as a reference. As a result, the CD of the stair case structure 136 can be secured to fall within the tolerance, and the contact plug 129 can be landed on the desired location, the yield and reliability of the process for fabricating the semiconductor device 100 thus can be improved significantly.

Figure 3:
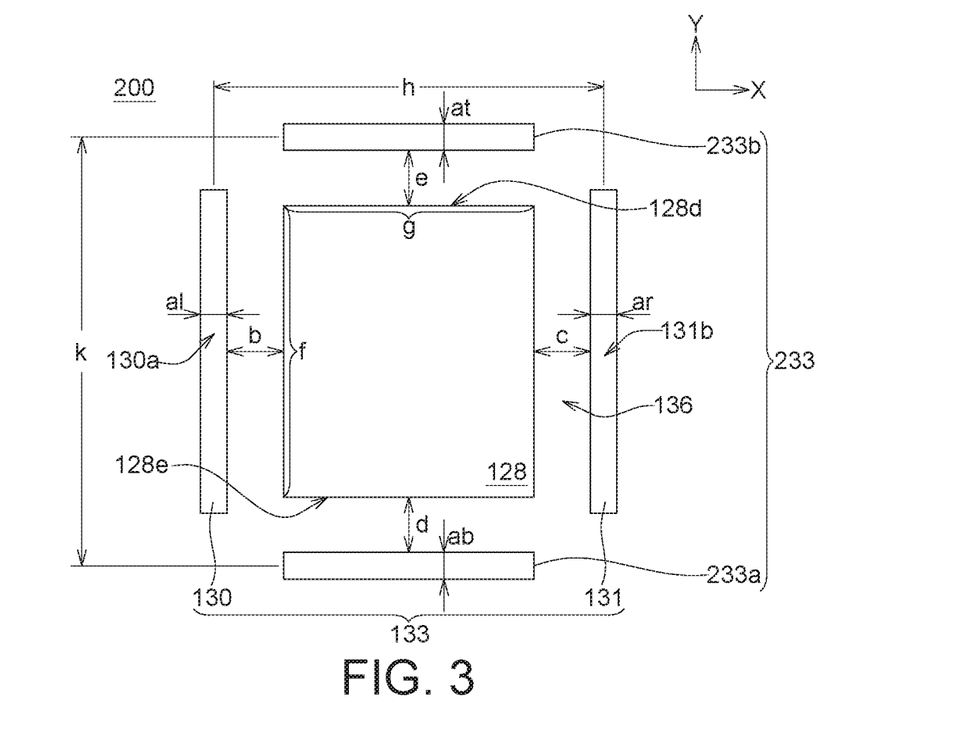
FIG. 3 is a top view illustrating a semiconductor device in accordance with another embodiment of the present disclosure.

However, it should be appreciated that the arrangement of the align mark may not be limited to this regards. In some embodiments, the align mark may further include other parts. FIG. 3 is a top view illustrating a semiconductor device 200 in accordance with another embodiment of the present disclosure. The structure of the semiconductor device 200 is similar to that of the semiconductor device 100 except that the align mark 233 of the semiconductor device 200 can further include a third part 233a and a fourth part 233b respectively disposed adjacent to the opposite sides of the stair case structure 136 along with a direction parallel to the Y-axil, wherein the centers of the third part 233a and the fourth part 233b depart from each other for a predetermined distance k along with the direction parallel to the Y-axil.

In the present embodiment, third part 233a and the fourth part 233b can be two parallel slits having a long axil parallel to the X-axis. The third part 233a has a width ab along with the Y-axis; the fourth part 233b has a width at along with the Y-axis; the stair case structure 136 respectively departs from the third part 233a for a distance d and departs from the fourth part 233b for a distance e along with the Y-axis; the memory cell array 128 has a width f along with the Y-axis (measured from the outer edge 128d to the outer edge 128e); and the sum of f, ab/2, at/2, d and e (f+ab/2+at/2+d+e) can be substantially equal to the predetermined distance k measured from the center of the third part 233a to the center of the fourth part 233b along with the Y-axis. In the present embodiment, the distance d and e are substantially less than 500 μm, and the predetermined distance k will larger than 2500 μm which closes to a device cell size (a size of single one of the memory cells 128a).

Figure 4:
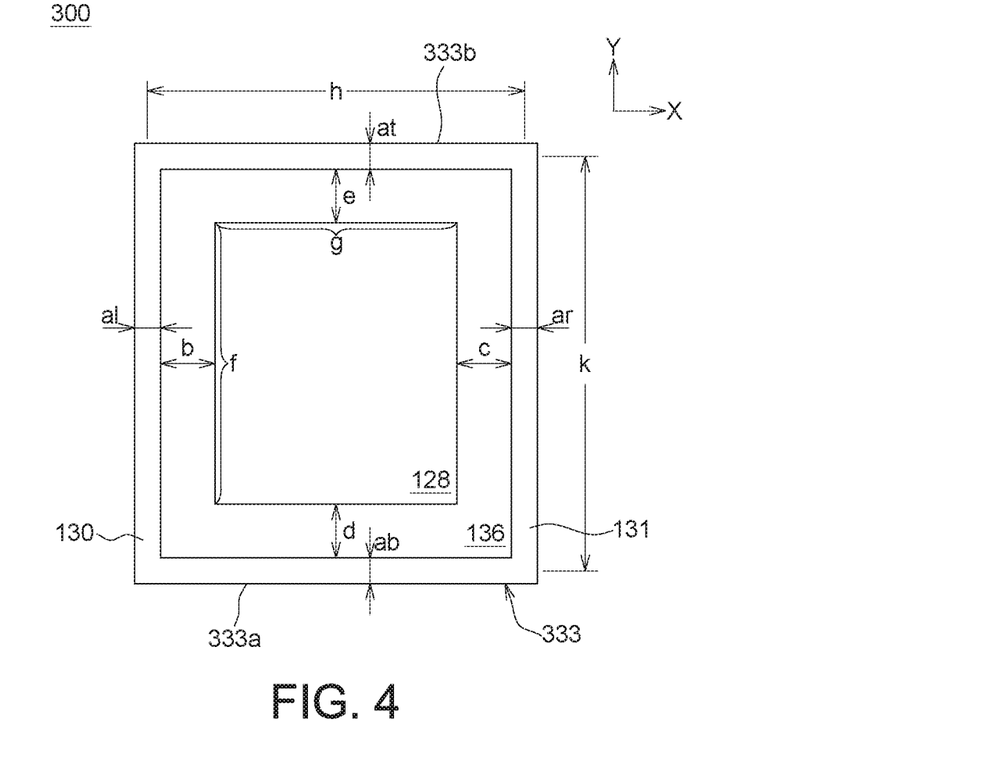
FIG. 4 is a top view illustrating a semiconductor device in accordance with yet another embodiment of the present disclosure.

FIG. 4 is a top view illustrating a semiconductor device 300 in accordance with yet another embodiment of the present disclosure. The structure of the semiconductor device 300 is similar to that of the semiconductor device 200 except that the third part 333a and the fourth part 333b of the align mark 333 are respectively connected to the first opening 131 (serving as the first part) and the second opening 132 (serving as the second part) to form a ring-shaped opening surrounding the stair case structure 136. In the present embodiment, the first opening 131 and the second opening 132 form a lateral symmetry with the stair case structure 136; and the third part 333a and the fourth part 333b form a lateral symmetry with the stair case structure 136.

In accordance with the aforementioned embodiments of the present disclosure, a semiconductor device and a CD defining method thereof are provided. An align mark including a first part and a second part is formed in a semiconductor substrate simultaneous to the forming of a circuit on a predetermined region of the semiconductor substrate, wherein the first part and the second part are disposed adjacent to two opposite sides of the circuit unit and depart from each other for a predetermined distance along with a direction. By forming the align mark, the photoresist used for forming the circuit unit can be precisely formed on the predetermined region located between the first part and the second part of the align mark. Such that the CD of the circuit unit can be secured to fall within the tolerance, and the yield and reliability of the process for fabricating the semiconductor device can be improved significantly.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A semiconductor device, comprising:
a semiconductor substrate;
a circuit unit, comprising a memory array, a first conductive layer, and at least one second conductive layer disposed on a predetermined region of the semicon- ductor substrate, the first conductive layer is under the at least one second conductive layer; and an align opening formed in the first conductive layer and only at a distance from a least one outer edge of the memory array in the predetermined region, wherein there is no landing contact formed directly on the align opening;

wherein the align opening comprises a first part and a second part respectively formed in the semiconductor substrate and adjacent to two opposite sides of the circuit unit, wherein the first part and the second part depart from each other for a first predetermined distance along with a first direction;

wherein the memory array comprises:
  a multilayers stack, having a plurality of insulating layers and the at least one second conductive layers alternatively stacked with each other on the semiconductor substrate;
  a plurality of memory cells, formed on the at least one second conductive layer; and
  a contact structure, extending outwards from the multilayers stack and electrically contacting to the at least one second conductive layer;

wherein the first part and the second part are respectively a first opening and a second opening extending into the semiconductor substrate; the contact structure is a stair case structure having a stair profile gradually declining from inside to out of the multilayers stack; and the first predetermined distance measured from a center of the first opening to a center of the second opening along with the first direction; and wherein the memory cell array has a width a along with the first direction; and the sum of the width g, half of the width al, half of the width ar, the distance b and the distance c (g+al/2+ar/2+b+c) is substantially equal to the predetermined distance.

2. The semiconductor device according to claim 1, wherein the first opening has a width al along with the first direction; the second opening has a width ar along with the first direction; the stair case structure departs from the first opening for a distance b and departs from the second opening for a distance c along with the first direction.

3. The semiconductor device according to claim 2, wherein the distance b and the distance c are substantially less than 500 micrometer (μm), and the first predetermined distance ranges substantially larger than 2500 μm.

4. The semiconductor device according to claim 1, wherein the stair case structure respectively departs from the first opening and the second opening for a distance substantially less than 5 μm.

5. The semiconductor device according to claim 1, wherein the stair case structure surrounds the memory cell array; and the first opening and the second opening form a lateral symmetry with the stair case structure.

6. The semiconductor device according to claim 1, wherein the align opening further comprises a third part and a fourth part respectively formed in the semiconductor substrate and adjacent to two opposite sides of the circuit unit, wherein the third part and the fourth part depart from each other for a second predetermined distance along with a second direction, and the second direction is perpendicular to the first predetermined distance.

7. A critical dimension (CD) defining method of a semiconductor device, comprising:
  providing a semiconductor substrate having a predetermined region;
  forming an align opening comprising a first part and a second part extending in to the semiconductor substrate and adjacent to two opposite sides of the predetermined region respectively, wherein the first part and the second part depart from each other for a first predetermined distance along with a first direction; and
  forming a circuit unit comprising a memory array on the predetermined region simultaneous to the forming of the align opening, wherein the forming of the circuit unit comprises:
    forming a multilayers stack having a plurality of insulating layers and a plurality of sacrificing layers alternatively stacked with each other and at least overlapping the predetermined region;
    forming a memory layer and a channel layer passing through the insulating layers and the sacrificing layers to make the memory layer disposed between the channel layer and portions of sacrificing layers;
    removing the sacrificing layers;
    forming a plurality of second conductive layers on the positions where the sacrificing layers initially occupied to define a memory cell array at intersection points of the conductive layers, the memory layer and the channel layer; and
    forming a contact structure, extending outwards from the multilayers stack and electrically contacting to the second conductive layers;
  wherein the forming of the align opening comprises steps of performing an opening etching process to form a first recess and a second recess in a portion of the multilayers stack extending beyond the predetermined region, wherein the first recess has a center departing form a center of the second recess for the first predetermined distance along with the first direction;
  wherein the forming of the contact structure comprises:
    forming a photoresist layer covering a portion of the multilayers stack disposed in the predetermined region, wherein the photoresist layer has a left edge and a right edge respectively depart from the first recess and the second recess for a distance substantially less than 5 μm;
    performing a first etching process to remove portions of a too-most insulating layer and a top-most sacrificing layer of the multilayers stack that are not covered by the photoresist layer;
    performing a photoresist trimming process to remove a portion of the photoresist layer and expose a portion of the too-most insulating layer;
    performing a second etching process to remove portions of the top-most insulating layer, the too-most sacrificing layer, a second insulating layer and a second sacrificing layer of the multilayers stack that are not covered by the photoresist layer;
  repeating the photoresist trimming process and the second etching process to form a first opening and a second opening in the semiconductor substrate respectively serving as the first part and the second part and to form a stair case structure having a stair profile gradually declining from inside to out of the multilayers stack;
  wherein the memory cell array has a width a along with the first direction; and the sum of the width g, half of the width al, half of the width ar, the distance b and the distance c (g+al/2+ar/2+b+c) is substantially equal to the predetermined distance.

8. The method according to claim 7, wherein the opening etching process is performed prior to the first etching process, and the first recess and the second recess respectively extend downwards passing through the top-most insulating layer and the top-most sacrificing layer.

9. The method according to claim 7, wherein the first opening has a width al along with the first direction; the second opening has a width ar along with the first direction; the stair case structure departs from the first opening for a distance b and departs from the second opening for a distance c along with the first direction; the memory cell array has a width g along with the first direction; and the sum of the width g, half of the width al, half of the width ar, the distance b and the distance c (g+al/2+ar/2+b+c) is substantially equal to the predetermined distance.

10. The method according to claim 9, wherein the distance b and the distance c are substantially less than 500 μm, and the first predetermined distance will larger than 2500 μm.

11. The method according to claim 7, wherein the forming of the align opening comprises steps of forming a third part and a fourth part in the semiconductor substrate respectively adjacent to two opposite sides of the circuit unit, wherein the third part and the fourth part depart from each other for a second predetermined distance along with a second direction, and the second direction is perpendicular to the first predetermined distance.

\* \* \* \* \*